United States Patent [19]

Lashway

[11] 3,986,822

[45] Oct. 19, 1976

[54] BORON NITRIDE CRUCIBLE

[75] Inventor: Robert William Lashway, Middleburg Heights, Ohio

[73] Assignee: Union Carbide Corporation, New York, N.Y.

[22] Filed: Feb. 27, 1975

[21] Appl. No.: 553,814

[52] U.S. Cl. .............................. 432/264; 432/265
[51] Int. Cl.² ........................................ F27B 14/10
[58] Field of Search .................... 432/262, 264, 265

[56] References Cited

UNITED STATES PATENTS

| | | |
|---|---|---|
| 3,063,865 | 11/1962 | Baer et al. .................... 432/264 X |
| 3,227,431 | 1/1966 | Steeves ............................ 432/264 |
| 3,649,734 | 3/1972 | Wilson ............................. 432/264 |
| 3,717,498 | 2/1973 | Franz et al. .................... 432/264 X |
| 3,724,996 | 4/1973 | Montgomery ..................... 432/264 |
| 3,734,480 | 5/1973 | Zanis et al. ...................... 432/264 |

Primary Examiner—John J. Camby
Attorney, Agent, or Firm—John S. Piscitello

[57] ABSTRACT

A boron nitride crucible, suitable for the vaporization of aluminum, having a multi-walled structure comprising an outer wall and a thinner inner wall weakly bonded to the thicker outer wall. Because of this structure, the crucible is considerably more flexible than conventional single-walled crucibles and exhibits substantially improved thermal cycling characteristics and longer life. The crucible is produced by depositing pyrolytic boron nitride upon a mandrel having the shape of the desired crucible at a temperature of from about 1850° C. to about 2100° C. until a first layer of boron nitride of suitable thickness has been produced, interrupting the deposition of boron nitride upon the mandrel and lowering the temperature to below 1750° C., and then depositing additional boron nitride upon the mandrel at a temperature of from about 1850° C. to about 2100° C. to produce a second outer layer of boron nitride having a thickness greater than that of the inner layer.

6 Claims, 2 Drawing Figures

U.S. Patent　　　　Oct. 19, 1976　　　　3,986,822
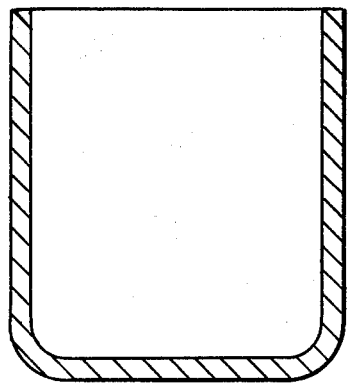
F I G. 1
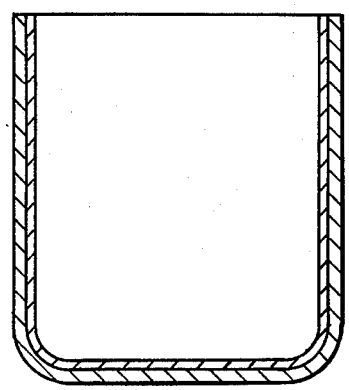
F I G. 2

BORON NITRIDE CRUCIBLE

BACKGROUND OF THE INVENTION

1. Field of the Invention

This invention relates to improved boron nitride evaporating crucibles. More particularly, this invention relates to improved pyrolytic boron nitride crucibles suitable for the vaporization of aluminum and other metals which wet boron nitride in their liquid state.

2. Description of the Prior Art

Pyrolytic boron nitride crucibles are used for the vacuum vaporization of metals and the deposition of thin films of such metals on various objects. Such procedure, of course, involves the use of the crucibles at highly elevated temperatures followed by subsequent cooling of the crucibles to room temperature. However, because of marked differences between the coefficients of thermal expansion of such crucibles and the metals vaporized therein, the crucibles often exhibit poor thermal cycling characteristics and a very high rate of catastrophic collapse upon cooldown subsequent to metal evaporation. Thus, for example, in the case of aluminum vaporization, about 80 per cent of the crucibles implode at a temperature between 250° C. and room temperature upon the first cool-down. This collapse is a result of the strong adhesion of the aluminum to the crucible walls and the contraction of the aluminum upon cooling at a rate about 20 times greater than that of the crucible.

SUMMARY OF THE INVENTION

In accordance with the present invention, it has been discovered that pyrolytic boron nitride evaporating crucibles having substantially improved thermal cycling characteristics and longer life can be obtained by providing such crucibles with a multi-walled structure comprising an outer wall and a thinner inner wall which is weakly bonded to the thicker outer wall. Because of this laminated structure, the crucibles of the present invention are considerably more flexible than conventional single-walled crucibles and, hence, more capable of withstanding the enormous stress exerted upon the crucible walls during cool-down. Thus, while conventional single-walled crucibles exhibit an 80 per cent failure rate on their initial cool-down after aluminum vaporization, in excess of 75 per cent of the multi-walled crucibles of the present invention have been found capable of withstanding in excess of 3 cool-down cycles without cracking.

The multi-walled evaporating crucibles of the present invention are produced by depositing pyrolytic boron nitride upon a mandrel having the shape of the desired crucible at a temperature of from about 1850° C. to about 2100° C. until a first layer of boron nitride of suitable thickness has been produced, interrupting the deposition of boron nitride upon the mandrel and lowering the temperature to below 1750° C., and then depositing additional boron nitride upon the mandrel at a temperature of from about 1850° C. to about 2100° C. to produce a second outer layer of boron nitride having a thickness greater than that of the inner layer. If desired, multiple layers of boron nitride can be produced by repeatedly interrupting the deposition process and lowering the temperature before depositing additional boron nitride. After the final layer which forms the outer wall of the crucible has been applied, the crucible is removed from the mandrel and, if necessary, cut to a desired length.

DESCRIPTION OF THE DRAWINGS

FIG. 1 is an elevational cross-sectional view of a conventional single walled pyrolytic boron nitride evaporating crucible.

FIG. 2 is an elevational cross-sectional view of a multi-walled pyrolytic boron nitride evaporating crucible produced in accordance with the present invention.

DESCRIPTION OF THE PREFERRED EMBODIMENTS

Pyrolytic boron nitride, as disclosed in U.S. Pat. No. 3,152,006, can be produced by the vapor-phase reaction of ammonia and a boron halide, such as boron trichloride. By depositing the boron nitride produced in this manner upon a suitable mandrel, a wide assortment of shapes can be produced.

In order to produce the crucibles of the present invention, the boron nitride is deposited upon a mandrel having the same shape as the desired crucible. Typically, a mandrel having a diameter of approximately 3.49 cm. and a height of about 4.13 cm. is employed. The mandrel employed, of course, must be one which does not melt at the temperature at which the boron nitride is applied and which is inert to the boron halide and ammonia at such temperature. Typically, the mandrel employed is made of graphite.

The mandrel upon which the boron nitride crucible is to be formed is mounted in a vapor deposition furnace and, after the furnace is heated to the desired temperature, the ammonia and boron halide gas are introduced into the reactor. According to the present invention, reaction between the ammonia and boron halide, and deposition of the boron nitride produced by this reaction, is effected at a temperature of from about 1850° C. to about 2100° C., and the reactor is accordingly maintained within this range. Preferably the temperature of the reactor is maintained between about 1900° C. and 1950° C.

The pressure in the furnace during the deposition should not exceed about 1 mm. of mercury absolute in order to produce a satisfactory crystalline boron nitride structure. The most desirable structure is produced when the pressure is maintained below about 0.5 mm. of mercury absolute.

The reactants are introduced into the reactor in vapor phase. Generally, at least 1 mole of ammonia is employed per mole of boron halide, with an excess of ammonia being preferred. Most preferably, from 2.5 to 3.5 moles of ammonia are employed per mole of boron halide, although even greater excesses can be employed if desired. The flow rate of the reactants through the reactor depends upon the specific design of the reactor and the size and shape of the mandrel upon which the boron nitride is to be deposited. Generally, flow rates of from about 0.2 standard cubic meters/hour to about 0.3 standard cubic meters/hour of ammonia and from about 0.06 standard cubic meters/hour to about 0.1 standard cubic meters/hour of boron halide per 1.5–2.5 cubic meters of furnace volume are suitable. If desired, an inert gas may be intermixed with the reactant gases.

After a suitable time, i.e., after the desired amount of boron nitride has been deposited on the mandrel, the flow of reactants into the reactor is interrupted and the reactor is cooled to a temperature below 1750° C.

Since this initial boron nitride deposit will ultimately comprise the inner wall of the desired crucible, the deposit should be as thin as practicable so as to provide a layer of maximum flexibility (to prevent the crucible from rupturing on cool-down when it is ultimately employed in the vaporization of aluminum or other metal). This thickness will vary somewhat depending upon the size of the desired crucible, but it is generally between 0.025 cm. and 0.076 cm. thick for crucibles having an inner diameter of from 2.5 cm. to 7.6 cm. Generally, the thickness of the inner wall of the crucible is about 50 per cent to about 75 per cent of the thickness of the outer wall.

After the temperature has dropped to below 1750° C., the reactor is once again heated to a temperature of from about 1850° C. to about 2100° C., the reactants are once again introduced into the reactor, and a second coating of boron nitride is deposited in the same manner as described above. If desired, one or more intermediate layers of boron nitride having a thickness no greater than the thickness of the initial layer can be applied before the final outer layer is formed by repeatedly interrupting the deposition process and lowering the temperature before depositing additional boron nitride. The final or outer layer of boron nitride applied should be thicker than the inner layer as its purpose is to provide rigid overall support for the crucible.

After the final layer of boron nitride has been deposited, the crucible is removed from the mandrel and, if necessary, cut to a desired length and cleaned.

The following example is set forth for purposes of illustration so that those skilled in the art may better understand this invention, and it should be understood that it is not to be construed as limiting this invention in any manner.

EXAMPLE

A graphite mandrel having a diameter of 3.49 cm. and a height of 4.13 cm. was mounted in a 1.5 cubic meter vapor deposition furnace. The pressure in the furnace was reduced to 0.3 mm. of mercury absolute and the temperature was raised to 1900° C. Gaseous boron trichloride and ammonia were then introduced into the reactor. The flow rate of the ammonia through the reactor was 0.21 standard cubic meters/hour, and the flow rate of the boron trichloride was 0.07 standard cubic meters/hour. After 7.5 hours of operation, the flow of ammonia and boron trichloride was interrupted, and the reactor was cooled to a temperature of about 1700° C. over a period of 1–2 hours. The reactor was then reheated to 1900° C. and the deposition process was continued for 10 hours.

After the reactor had cooled to room temperature, the multi-walled boron nitride crucible produced in this manner was removed from the graphite mandrel. This crucible had an inner wall 0.038 cm. thick and an outer wall 0.051 cm. thick.

A total of 22 crucibles were produced in this manner. Of these crucibles, only five cracked upon their initial cool-down after aluminum vaporization tests. The remaining 17 were capable of withstanding in excess of three cool-down cycles.

When single-walled crucibles of like size and shape and thickness (0.089 cm. thick) were prepared in like manner but without interruption of the deposition process, only eight of the 39 crucibles prepared failed to crack upon their initial cool-down after aluminum vaporization tests.

What is claimed is:

1. A pyrolytic boron nitride crucible, suitable for the vaporization of aluminum, having a multi-walled structure comprising an outer wall of pyrolytic boron nitride and a thinner inner wall of pyrolytic boron nitride laminated to the thicker outer wall.

2. A crucible as in claim 1 wherein the thickness of the inner wall of the crucible is about 50 per cent to about 75 per cent of the thickness of the outer wall.

3. A crucible as in claim 2 wherein the crucible has an inner diameter of from 2.5 cm. to 7.6 cm. and the thickness of the inner wall of the crucible is between 0.025 cm. and 0.076 cm.

4. A pyrolytic boron nitride crucible, suitable for the vaporization of aluminum, having a multi-walled structure comprising an outer wall of pyrolytic boron nitride, an inner wall of pyrolytic boron nitride, and at least one intermediate wall of pyrolytic boron nitride, said walls being laminated to each other, said outer wall being of greater thickness than the inner and intermediate walls, and said intermediate walls being of no greater thickness than the inner wall.

5. A crucible as in claim 4 wherein the thickness of the inner wall of the crucible is about 50 per cent to about 75 per cent of the thickness of the outer wall.

6. A crucible as in claim 5 wherein the crucible has an inner diameter of from 2.5 cm. to 7.6 cm. and the thickness of the inner wall of the crucible is between 0.025 cm. and 0.076 cm.

* * * * *